(12) United States Patent
Matsushita et al.

(10) Patent No.: US 8,441,880 B2
(45) Date of Patent: May 14, 2013

(54) NONVOLATILE MEMORY, DATA PROCESSING APPARATUS, AND MICROCOMPUTER APPLICATION SYSTEM

(75) Inventors: Toru Matsushita, Kanagawa (JP); Ken Matsubara, Kanagawa (JP); Takashi Iwase, Kanagawa (JP); Hidenori Mitani, Kanagawa (JP); Jun Setogawa, Kanagawa (JP); Fumiko Yamada, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 140 days.

(21) Appl. No.: 13/171,849

(22) Filed: Jun. 29, 2011

(65) Prior Publication Data

US 2012/0002498 A1    Jan. 5, 2012

(30) Foreign Application Priority Data

Jun. 30, 2010    (JP) ................. 2010-149252

(51) Int. Cl.
  *G11C 5/14*    (2006.01)
(52) U.S. Cl.
  USPC .................. 365/226; 365/189.09; 365/189.11
(58) Field of Classification Search .................. 365/226, 365/189.09, 189.11
  See application file for complete search history.

(56) References Cited

U.S. PATENT DOCUMENTS

| | | | |
|---|---|---|---|
| 6,181,629 B1 * | 1/2001 | Ogura | 365/227 |
| 6,330,192 B1 * | 12/2001 | Ohba et al. | 365/185.3 |
| 6,385,086 B1 * | 5/2002 | Mihara et al. | 365/185.11 |
| 6,480,057 B2 * | 11/2002 | Ogura | 327/536 |
| 6,515,908 B2 * | 2/2003 | Miyawaki et al. | 365/185.22 |
| 7,385,869 B2 | 6/2008 | Ishikawa et al. | |
| 7,554,844 B2 | 6/2009 | Werner et al. | |

FOREIGN PATENT DOCUMENTS

| | | |
|---|---|---|
| JP | 5-189961 A | 7/1993 |
| JP | 10-214496 A | 8/1998 |
| JP | 2002-519808 A | 7/2002 |

* cited by examiner

*Primary Examiner* — Pho M Luu
(74) *Attorney, Agent, or Firm* — Miles & Stockbridge P.C.

(57) ABSTRACT

Operational stability of the nonvolatile memory in plural power supply voltage modes set up in advance corresponding to the power supply voltage level is realized. A nonvolatile memory is configured with a memory array, a charge pump, a distributor for selecting an output voltage of the charge pump, and a sequencer for controlling operation of the charge pump and the distributor. The nonvolatile memory is also provided with an analyzer which notifies the sequencer of a power supply voltage mode selectively specified among plural power supply voltage modes set up in advance corresponding to power supply voltage levels, and which detects mismatch between the power supply voltage mode notified to the sequencer and an actually supplied power supply voltage and limits the operation of the charge pump and the distributor with the use of the sequencer, based on the detection result. An operational stability of the nonvolatile memory is realized.

14 Claims, 15 Drawing Sheets

FIG. 2

| Vcc | Vcc_detect_H | Vcc_detect_L |
|---|---|---|
| Vcc < VccHmin | L | L |
| VccHmin ≤ Vcc < VccLmax | L | H |
| VccLmax ≤ Vcc | H | H |

FIG. 3

| Vcc_detect_H | Vcc_detect_L | Vcc_mode_latched | Vcc_err |
|---|---|---|---|
| L | L | L | L |
| L | L | H | H (ERROR) |
| L | H | L | L |
| L | H | H | L |
| H | H | L | H (ERROR) |
| H | H | H | L |

FIG. 12

| Vcc | Vcc_detect_J |
|---|---|
| Vcc < VccJ | L |
| VccJ ≤ Vcc | H |

FIG. 13

| Vcc_detect_J | Vcc_mode_latched |
|---|---|
| L | L |
| H | H |

NONVOLATILE MEMORY, DATA PROCESSING APPARATUS, AND MICROCOMPUTER APPLICATION SYSTEM

CROSS-REFERENCE TO RELATED APPLICATIONS

The disclosure of Japanese Patent Application No. 2010-149252 filed on Jun. 30, 2010 including the specification, drawings and abstract is incorporated herein by reference in its entirety.

BACKGROUND

The present invention relates to technology for realizing a stable rewrite operation of a nonvolatile memory device, and to technology which is effective when applied to a flash memory, for example.

In performing a step-up for word line driver voltage in a PSRAM of wide power specifications, Patent Document 1 discloses technology for eliminating waste of consumption current due to instability of a current value near the mode switching point of the step-up operation, and attaining low power consumption. According to the technology, the PSRAM operates in a normal operation mode in which power supply voltage VCCH is supplied and in a data retention mode in which power supply voltage VCCL is supplied, and a double voltage generation circuit of a voltage supplying circuit is designed to switch a step-up mode at the time of generating step-up voltage VCH, correspondingly to whether the power supply voltage VCC is equal to or higher than a predetermined value VCCM.

Patent Document 2 discloses a charge pump which is adjustable in response to external power supply voltage. The number of stages employed at the time of operation of the charge pump changes corresponding to an operating state of an integrated circuit. The number of stages employed assures generation of a suitable voltage output, irrespective of changes of the operating state such as a variation of a power supply voltage level for example. The power supply voltage level is detected using a power supply level detection circuit. A logic circuit receives information from a voltage level detection circuit included in the power supply level detection circuit, and adjusts the charge pump so that only a specific number of stages may be employed.

Patent Document 3 discloses a circuit system in which an external power supply voltage is clamped to a voltage lower than it and the clamped voltage is used as a reference supply of a charge pump. Accordingly, it becomes possible to operate the circuit even when a range of the external power supply voltage is wide.

(Patent Document 1) Japanese Patent Laid-open No. Hei 5 (1993)-189961
(Patent Document 2) Japanese Patent Laid-open No. 2002-519808 (Japanese Translation of International Publication No. WO2000/00983)
(Patent Document 3) Japanese Patent Laid-open No. Hei 10 (1998)-214496

SUMMARY

In a flash memory as an example of a nonvolatile memory, the power supply uses externally-supplied high-potential-side power source voltage Vcc which is mainly supplied to a charge pump etc., and power supply voltage Vdd which is mainly supplied to a logic circuit etc. As to the power supply voltage Vdd, it may be supplied from the exterior, or it may be appropriated with internal power supply voltage Vdd which is obtained internally by stepping down the high-potential-side power source voltage Vcc. A write and an erase to a flash memory built in a microcomputer etc. are performed via a main sequencer serving as an interface circuit between a CPU and the flash memory. When a write instruction from the CPU to the flash memory is received for example, the main sequencer issues repeatedly a write instruction and a write verification instruction to the flash memory until a threshold voltage of the flash memory reaches a writing state. When an erase instruction from the CPU to the flash memory is received, the main sequencer issues repeatedly an erase instruction and an erase verify instruction to the flash memory until a threshold voltage of the flash memory reaches an erasing state. Hereinafter, the state where a write instruction is issued from the main sequencer to the flash memory is described as a write mode, the state where a write verification instruction is issued is described as a write verify mode, the state where an erase instruction is issued is described as an erase mode, and the state where an erase verify instruction is issued is described as an erase verify mode. The flash memory is provided with a sub sequencer which manages sequence, corresponding to the modes, such as the write mode, the write verify mode, the erase mode, and the erase verify mode. The sub sequencer controls a charge pump, a distributor which switches directly coupling of the charge pump to a peripheral circuit and others. Since the charge pump generates high voltage based on the power supply voltage Vcc inside the flash memory, it is necessary for the sub sequencer to perform power supply starting processing, a bias application (voltage application), and discharge processing, by controlling the sequence finely not to destroy a device. The inventors of the present application have examined this, point and found the following problem.

Since a charge pump steps up power supply voltage Vcc, when high power supply voltage Vcc (henceforth a "high Vcc") is applied to a flash memory mounting a charge pump which is designed for low power supply voltage Vcc (henceforth a "low Vcc"), there is a possibility that excessive step-up may occur, leading to device destruction.

When a low Vcc is applied to a flash memory mounting a charge pump which is designed for a high Vcc, on the other hand, a necessary step-up level cannot be reached; accordingly, a write and an erase can not be performed.

In order to solve the problem described above, it is possible to clamp the power supply voltage Vcc to a voltage lower than the minimum and to perform step up on the basis of the clamped voltage, as disclosed by Patent Document 3. However, in this case, since a charge pump may step up the clamped low reference voltage, even when the power supply voltage Vcc is high, it requires time for the step-up, causing deterioration of a write speed or an erase speed in a high Vcc.

As a power supply voltage mode of a flash memory, a power supply voltage mode corresponding to a low Vcc (henceforth a "low Vcc mode") and a power supply voltage mode corresponding to a high Vcc (henceforth a "high Vcc mode") can be provided. However, if the power supply voltage mode changes during a write or an erase (including a verify), not only there arises a possibility of a circuit malfunction, but also it becomes difficult to secure the reliability of a verify.

In Patent Documents 1, 2, and 3 cited above, no consideration is taken about the problems as described above.

The present invention has been made in view of the above circumstances and provides technology for realizing operational stability of a nonvolatile memory, in plural power supply voltage modes which are set up in advance corresponding to a power supply voltage level. The present invention also intends to provide a data processing apparatus which mounts a nonvolatile memory in which operational stability is realized in plural power supply voltage modes set up in advance corresponding to a power supply voltage level, and a microcomputer application system which mounts such a data processing apparatus.

The above and other purposes and new features will become clear from description of the specification and the accompanying drawings of the present invention.

The following explains briefly an outline of typical inventions to be disclosed by the present application.

That is, a nonvolatile memory comprises a memory array (149) in which nonvolatile memory cells are arranged, a charge pump (152) which is able to step up supplied power supply voltage, and to output the step-up voltage, a distributor (151) which is able to select an output voltage of the charge pump for data writing or an erase operation to the memory array, and a sequencer (145) which is able to control operation of the charge pump and the distributor. The nonvolatile memory further comprises an analyzer which is able to notify the sequencer of a power supply voltage mode selectively specified among plural power supply voltage modes set up in advance corresponding to power supply voltage levels, and which detects a mismatch between the power supply voltage mode notified to the sequencer and the actually supplied power supply voltage and limits the operation of the charge pump and the distributor with the use of the sequencer, based on the detection result. The data processing apparatus is configured including such a nonvolatile memory cell. The microcomputer application system is configured including such a data processing apparatus.

The following explains briefly an effect obtained by the typical inventions to be disclosed in the present application.

That is, it is possible to provide technology for realizing operational stability of a nonvolatile memory, in plural power supply voltage modes which are set up in advance corresponding to a power supply voltage level. It is also possible to provide a data processing apparatus mounting a nonvolatile memory in which operational stability is realized, in plural power supply voltage modes set up in advance corresponding to a power supply voltage level, and a microcomputer application system mounting such a data processing apparatus.

BRIEF DESCRIPTION OF THE DRAWINGS

FIG. 2 is an explanatory diagram illustrating a truth table of output logic of a detector included in the microcomputer illustrated in FIG. 1;

FIG. 3 is an explanatory diagram illustrating a truth table of output logic of a Vcc analyzer included in the microcomputer illustrated in FIG. 1;

FIG. 12 is an explanatory diagram illustrating a truth table of output logic of a detector included in the microcomputer illustrated in FIG. 11;

FIG. 13 is an explanatory diagram illustrating a truth table of output logic of a Vcc analyzer included in the microcomputer illustrated in FIG. 11;

DETAILED DESCRIPTION

1. Outline of Embodiment

Figure 1:
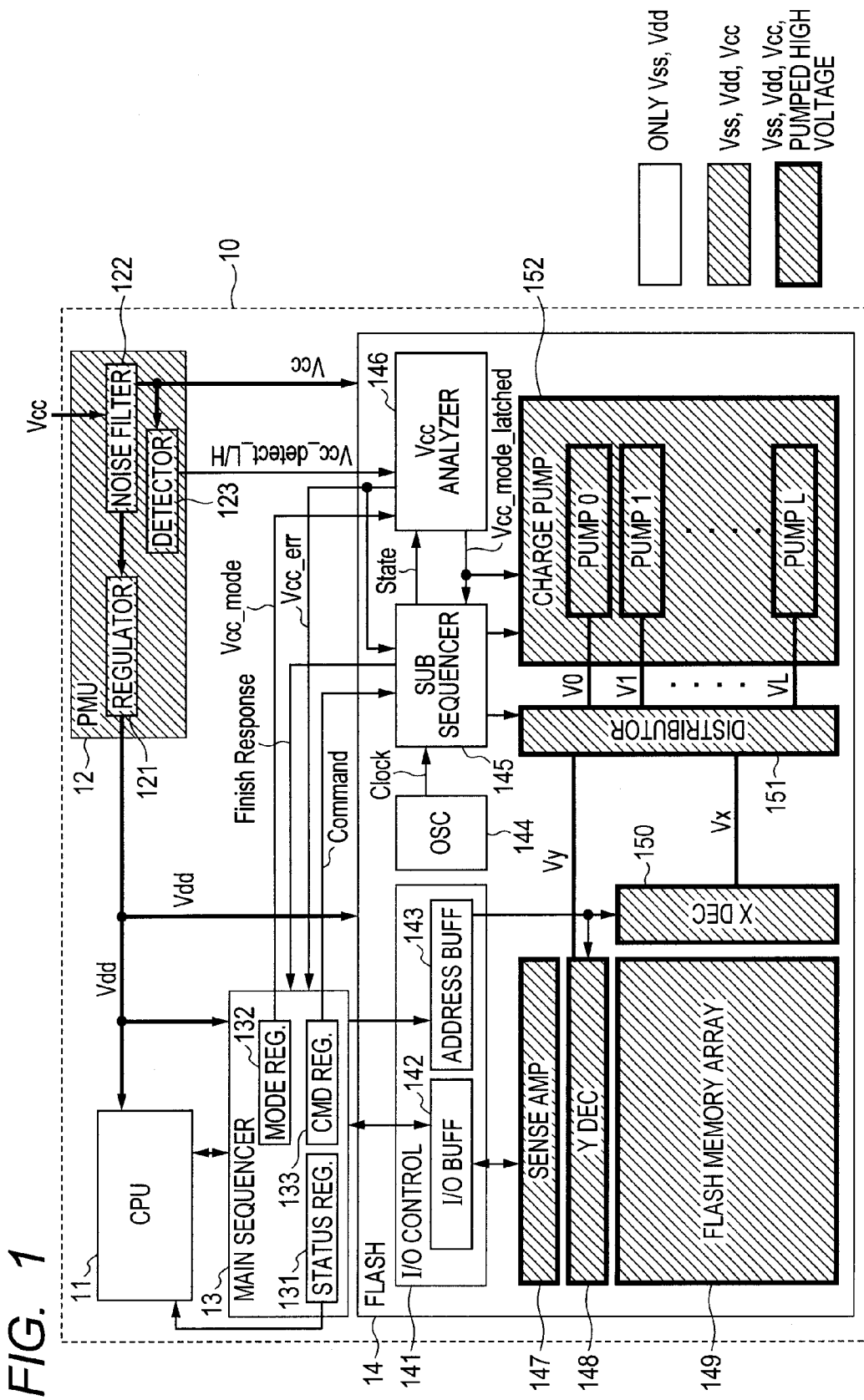
FIG. 1 is a block diagram illustrating an example of a configuration of a microcomputer as an example of a data processing apparatus according to the present invention.

First, an outline of a typical embodiment of the invention disclosed in the present application is explained. A numerical symbol of the drawing referred to in parentheses in the outline explanation about the typical embodiment only illustrates what is included in the concept of the component to which the numerical symbol is attached.

(1) A nonvolatile memory (14) according to a typical embodiment of the present invention is configured as follows.

That is, the nonvolatile memory (14) comprises a memory array (149) in which nonvolatile memory cells are arranged, a charge pump (152) which is able to step up supplied power supply voltage, and to output the step-up voltage, a distributor (151) which is able to select an output voltage of the charge pump for data writing or an erase operation to the memory array, and a sequencer (145) which is able to control operation of the charge pump and the distributor. The nonvolatile memory further comprises an analyzer (146). The analyzer notifies the sequencer of a power supply voltage mode selectively specified among plural power supply voltage modes set up in advance corresponding to power supply voltage levels. The analyzer also detects a mismatch between the power supply voltage mode notified to the sequencer and the actually supplied power supply voltage and limits the operation of the charge pump and the distributor with the use of the sequencer, based on the detection result.

According to the configuration, since a control sequence of the distributor and the charge pump can be switched corresponding to the power supply voltage mode, neither an excessive step-up nor a shortage of a step-up will occur as far as the power supply voltage Vcc is in a suitable range to the power supply voltage mode. Accordingly, it is possible to secure operational stability of the nonvolatile memory in plural power supply voltage modes set up in advance corresponding to the power supply voltage level. It is also possible to detect a mismatch between the power supply voltage mode notified to the sequencer and the actually supplied power supply voltage and to limit the operation of the charge pump and the distributor with the use of the sequencer, based on the detection result. Therefore, it is possible to avoid, for example, a situation where device destruction may be caused by accidental application of a high Vcc in the low Vcc mode.

(2) In Paragraph (1), it is possible to configure the analyzer so as to assert an error signal which can limit the operation of the charge pump and the distributor with the use of the sequencer, based on the detection result of the mismatch between the power supply voltage mode notified to the sequencer and the actually supplied power supply voltage. It is also possible to configure the sequencer such that, when the analyzer asserts the error signal during a write or an erase to the memory array, the sequencer initializes the distributor after a charge of the charge pump has been discharged. Accordingly, an undesirable charge is not stored in the charge pump; therefore, it is possible to avoid device destruction.

(3) In Paragraph (2), by changing a write speed and an erase speed to the memory array, corresponding to the power supply voltage mode notified to the sequencer by the analyzer, a write and an erase can be performed at speed corresponding to the power supply voltage mode notified to the sequencer.

(4) In Paragraph (3), it is possible to configure the analyzer so as to include a holding circuit for holding the power supply voltage mode up to that time to the sequencer, during a control period by the sequencer. By including the holding circuit, it is possible to prevent the power supply voltage mode from changing undesirably during the control period by the sequencer. Accordingly, it is possible to prevent a circuit malfunction and to secure the reliability of a verify.

(5) A nonvolatile memory (14) according to another typical embodiment of the present invention is configured as follows.

That is, a nonvolatile memory comprises a memory array (149) in which nonvolatile memory cells are arranged, a charge pump (152) which is able to step up supplied voltage, and to output the step-up voltage, a distributor (151) which is able to select an output voltage of the charge pump for data writing or an erase operation to the memory array, and a sequencer (145) which is able to control operation of the charge pump and the distributor. The nonvolatile memory further comprises an analyzer. The analyzer determines a power supply voltage mode based on a comparison result of a reference level set up in advance and an actually supplied power supply voltage and notifies the sequencer of the power supply voltage mode concerned. The analyzer also detects a mismatch between the power supply voltage mode notified to the sequencer and the actually supplied power supply voltage and limits the operation of the charge pump and the distributor with the use of the sequencer, based on the detection result.

According to the configuration, the power supply voltage mode is determined based on the comparison result of the reference level set up in advance and the actually supplied power supply voltage. Therefore, a suitable power supply voltage mode is determined automatically, without the need to specify the power supply voltage mode. Thereby, it is possible to realize operational stability of the nonvolatile memory in plural power supply voltage modes set up in advance corresponding to the power supply voltage level. By detecting a mismatch between the power supply voltage mode notified to the sequencer and the actually supplied power supply voltage and by limiting the operation of the charge pump and the distributor with the use of the sequencer, based on the detection result, it is possible to avoid, for example, a situation where device destruction may be caused by accidental application of a high Vcc in the low Vcc mode.

(6) In Paragraph (5), it is possible to configure the analyzer so as to assert an error signal which can limit the operation of the charge pump and the distributor with the use of the sequencer, based on the detection result of the mismatch between the power supply voltage mode notified to the sequencer and the actually supplied power supply voltage. It is also possible to configure the sequencer such that, when the analyzer asserts the error signal during a write or an erase to the memory array, the sequencer initializes the distributor after a charge of the charge pump has been discharged. Accordingly, an undesirable charge is not stored in the charge pump; therefore, it is possible to avoid device destruction.

(7) A data processing apparatus (10) according to a typical embodiment of the present invention includes a nonvolatile memory unit (14) and a central processing unit (11) which is accessible to the nonvolatile memory unit. At this time, the nonvolatile memory unit is provided with a memory array (149) in which nonvolatile memory cells are arranged, a charge pump (152) which is able to step up supplied power supply voltage, and to output the step-up voltage, a distributor (151) which is able to select an output voltage of the charge pump for data writing or an erase operation to the memory array, and a sequencer (145) which is able to control operation of the charge pump and the distributor. The nonvolatile memory unit is further provided with an analyzer (146). The analyzer is able to notify the sequencer of a power supply voltage mode selectively specified among plural power supply voltage modes set up in advance corresponding to power supply voltage levels. The analyzer also detects a mismatch between the power supply voltage mode notified to the sequencer and the actually supplied power supply voltage and asserts an error signal which can limit the operation of the charge pump and the distributor with the use of the sequencer, based on the detection result. According to the configuration, since the control sequence of the distributor and the charge pump is switched according to the power supply voltage mode, neither an excessive step-up nor a shortage of a step-up will occur as far as the power supply voltage Vcc is in a suitable range to the power supply voltage mode. It is also possible to detect a mismatch between the power supply voltage mode notified to the sequencer and the actually supplied power supply voltage and to limit the operation of the charge pump and the distributor with the use of the sequencer, based on the detection result. Accordingly, it is possible to avoid, for example, a situation where device destruction may be caused by accidental application of a high Vcc in the low Vcc mode. Accordingly, improvement in the reliability of the data processing apparatus can be attained.

(8) In Paragraph (7), the power supply voltage mode includes a first power supply voltage mode and a second power supply voltage mode which differ in the corresponding power supply voltage level with each other. By providing a detector for detecting relation among a minimum voltage in which circuit operation is possible in the first power supply voltage mode, a maximum voltage in which circuit operation is possible in the second power supply voltage mode, and an actually supplied power supply voltage, it is possible to detect the relation among the minimum voltage in which circuit operation is possible in the first power supply voltage mode, the maximum voltage in which circuit operation is possible in the second power supply voltage mode, and the actually supplied power supply voltage. It is possible to configure the analyzer so as to detect a mismatch between the power supply voltage mode and the actually supplied power supply voltage, based on the detection result by the detector and the power supply voltage mode, and to assert an error signal which can limit operation of the charge pump and the distributor with the use of the sequencer, based on the detection result.

(9) A data processing apparatus (10) according to another embodiment of the present invention includes a nonvolatile memory unit and a central processing unit which is accessible to the nonvolatile memory unit. At this time, the nonvolatile memory unit is provided with a memory array (149) in which nonvolatile memory cells are arranged, a charge pump (152) which is able to step up supplied power supply voltage, and to output the step-up voltage, a distributor (151) which is able to select an output voltage of the charge pump for data writing or an erase operation to the memory array, and a sequencer (145) which is able to control operation of the charge pump and the distributor. The nonvolatile memory unit is further provided with an analyzer. The analyzer notifies the sequencer of a power supply voltage mode selectively specified among plural power supply voltage modes set up in advance corresponding to power supply voltage levels. The analyzer also detects a mismatch between the power supply voltage mode notified to the sequencer and the actually supplied power supply voltage and asserts an error signal which can limit the operation of the charge pump and the distributor with the use of the sequencer, based on the detection result.

According to the configuration, the power supply voltage mode is determined based on the comparison result of the reference level set up in advance and the actually supplied power supply voltage. Therefore, a suitable power supply voltage mode is determined automatically, without the need to specify the power supply voltage mode. By detecting the mismatch between the power supply voltage mode notified to the sequencer and the actually supplied power supply voltage and by limiting the operation of the charge pump and the distributor with the use of the sequencer, based on the detection result, it is possible to avoid, for example, a situation where device destruction may be caused by accidental application of a high Vcc in the low Vcc mode. Accordingly, improvement in the reliability of the data processing apparatus can be attained.

(10) In Paragraph (9), when the power supply voltage mode includes a first power supply voltage mode and a second power supply voltage mode which differ in the corresponding power supply voltage level with each other, the data processing apparatus includes a detector (123) for detecting relation among a minimum voltage in which circuit operation is possible in the first power supply voltage mode, a maximum voltage in which circuit operation is possible in the second power supply voltage mode, and an actually supplied power supply voltage. By the detector, it is possible to detect the relation among the minimum voltage in which circuit operation is possible in the first power supply voltage mode, the maximum voltage in which circuit operation is possible in the second power supply voltage mode, and the actually supplied power supply voltage. It is possible to configure the analyzer (146) so as to detect a mismatch between the power supply voltage mode and an actually supplied power supply voltage, based on the detection result by the detector and the power supply voltage mode, and to assert an error signal which can limit operation of the charge pump and the distributor with the use of the sequencer, based on the detection result.

(11) In a microcomputer application system mounting a microcomputer which executes a predetermined program, the data processing apparatus according to Paragraphs (7)-(10) is applied as the microcomputer. Accordingly, improvement in the reliability of the microcomputer application system can be attained.

2. Details of Embodiment

The embodiments are explained in more detail.

First Embodiment

FIG. 1 illustrates a microcomputer (sometimes called a "micro control unit") as an example of a data processing apparatus according to the present invention.

Although not limited in particular, a microcomputer 10 illustrated in FIG. 1 includes a CPU (central processing unit) 11, a power supply management unit (PMU) 12, a main sequencer 13, and a flash memory 14. The microcomputer 100 is formed over a semiconductor substrate, such as a single crystal silicone substrate, by a well-known semiconductor integrated circuit manufacturing technology. FIG. 1 illustrates a block configuration mainly relevant to a write and an erase to the flash memory 14.

The CPU 11 executes predetermined arithmetic processing according to a program stored in the flash memory 14. A write and an erase from the CPU 11 to the flash memory 14 are performed via the main sequencer 13. The main sequencer 13 includes a status register (status reg.) 131, a mode register (mode reg.) 132, and a command register (cmd reg.) 133. The main sequencer 13 controls sequentially operation of the flash memory 14 according to a command from the CPU 11. A status of the main sequencer 13 is set to the status register 131. Vcc modes, such as a high Vcc mode and a low Vcc mode, are set to the mode register 132. Various commands issued from the CPU 11, such as a write command and an erase command, are set to the command register 133.

The power supply management unit 12 includes a regulator 121, a noise filter 122, and a detector 123, and performs power supply management in the microcomputer 10. The noise filter 122 reduces a noise included in the high-potential-side power source voltage Vcc on the basis of the low-potential-side power source voltage Vss (ground level). The regulator 121 steps down the high-potential-side power source voltage Vcc outputted from the noise filter 122, to generate an internal power supply voltage Vdd. This internal power supply voltage Vdd is transferred to the CPU 11, the main sequencer 13, and the flash memory 14. The detector 123 detects the high-potential-side power source voltage Vcc outputted from the noise filter 122, to output the detection results Vcc_detect_H and Vcc_detect_L. A logical value of the detection results Vcc_detect_H and Vcc_detect_L is determined based on the truth table illustrated in FIG. 2.

FIG. 2 illustrates a truth table of output logic of the detector 123. In FIG. 2, a symbol "H" indicates a high level (logical value "1"), and a symbol "L" indicates a low level (logical value "0"). Assuming that a minimum voltage in which circuit operation is possible in the high Vcc mode is "VccHmin" and that a maximum voltage in which circuit operation is possible in the low Vcc mode is "VccLmax", if Vcc<VccHmin holds, the detection results Vcc_detect_H and Vcc_detect_L are set to "L" and "L." If VccHmin≦Vcc<VccLmax holds, the detection results Vcc_detect_H and Vcc_detect_L are set to "L" and "H." If VccLmax≦Vcc holds, the detection results Vcc_detect_H and Vcc_detect_L are set to "H" and "H."

The flash memory 14 includes an I/O control circuit 141, an oscillator (OSC) 144, a sub sequencer 145, a Vcc analyzer 146, a sense amplifier (Sense Amp) 147, a column decoder (Y Dec) 148, a flash memory array 149, and a row decoder (X Dec) 150. The flash memory 14 includes also a distributor 151 and a charge pump circuit 152.

The I/O control circuit (I/O Control) 141 has a function for controlling signal input-output in the flash memory 14, and includes an I/O buffer (I/O Buff) 142 and an address buffer (Address Buff) 143. The oscillator 144 generates a clock signal Clock. The generated clock signal Clock is transferred to the sub sequencer 145. The sub sequencer 145 controls sequentially operation of the distributor 151 and the charge pump circuit 152. The Vcc analyzer 146 checks the matching among Vcc_mode, Vcc_detect_L, and Vcc_detect_H, and asserts an error signal Vcc_err when a mismatch occurs. An assertion state of the error signal Vcc_err is held until it is cleared by the main sequencer 13. The sense amplifier 147 obtains read-out data by comparing with a reference level a signal selectively outputted from the flash memory array 149 based on an output of the column decoder 148. The column decoder 148 generates a selection signal of a column system by decoding a column address. The flash memory array 149 is configured by plural flash memory cells arranged in a row direction and a column direction. This nonvolatile memory cell comprises electrodes of a control gate, a floating gate, a drain, and a source. The drains of plural flash memory cells arranged in the column direction are coupled in common, and coupled with a bit line via a sub bit-line selector. The sources of plural flash memory cells are coupled to a common source line. The flash memory cells coupled to the common source line configures one block, and they are formed in a common well area of the semiconductor substrate, acting as a unit of an erase. On the other hand, the control gates of plural flash memory cells arranged in the row direction are coupled to a word line in units of row. The row decoder 150 drives a word line in the flash memory array 149 to a selection level by decoding a row address transferred via the address buffer 143. The charge pump circuit 152 includes charge pumps Pump 0-Pump L ("L" is a positive integer excluding zero (0)). The charge pumps Pump 0-Pump L generate respectively-predetermined output voltages V0-VL. These output voltages V0-VL are transferred to the distributor 151. The distributor 151 transfers selectively the output voltages V0-VL of the charge pumps Pump 0-Pump L to the column decoder 148 and the row decoder 150, according to the output of the sub sequencer 145.

In the configuration described above, a power supply voltage to be supplied is different, depending on a circuit.

For example, in the power management unit 12, the high-potential-side power source voltage Vcc and the internal power supply voltage Vdd on the basis of the low-potential-side power source voltage Vss are used. To the CPU 11, the main regulator 13, the I/O controller 141, the oscillator 144, the sub sequencer 145, and the Vcc analyzer 146, the internal power supply voltage Vdd on the basis of the low-potential-side power source voltage Vss is applied for respective operations. To the sense amplifier 147, the column decoder 148, the flash memory 149, the row decoder 150, the distributor 151, and the charge pump circuit 152, a high voltage generated by the charge pump circuit 152 is applied, in addition to the high-potential-side power source voltage Vcc and the internal power supply voltage Vdd on the basis of the low-potential-side power source voltage Vss.

FIG. 3 illustrates a truth table of output logic of a Vcc matching confirmatory result in the Vcc analyzer 146.

When a mismatch occurs in Vcc_mod_latched, Vcc_detect_H, and Vcc_detect_L, Vcc_err is asserted to a high level (H) by the Vcc analyzer 146. For example, when the detection results Vcc_detect_H and Vcc_detect_L are "L" and "L" (Vcc<VccHmin), irrespective of Vcc_mod_latched set to "H" by user specification, a mismatch is present; therefore, Vcc_err is asserted to a high level (H) by the Vcc analyzer 146. When the detection result Vcc_detect_H and Vcc_detect_L are "H" and "H" (VccLmax≦Vcc), irrespective of Vcc_mod_latched set to "L" by user specification, a mismatch is present; therefore, Vcc_err is asserted to a high level (H) by the Vcc analyzer 146. The logical value of Vcc_err is held by the Vcc analyzer 146 until it is cleared by the main sequencer 13. When matching is obtained in Vcc_mod_latched, Vcc_detect_H, and Vcc_detect_L, Vcc_err is negated to a low level (L).

Figure 4:
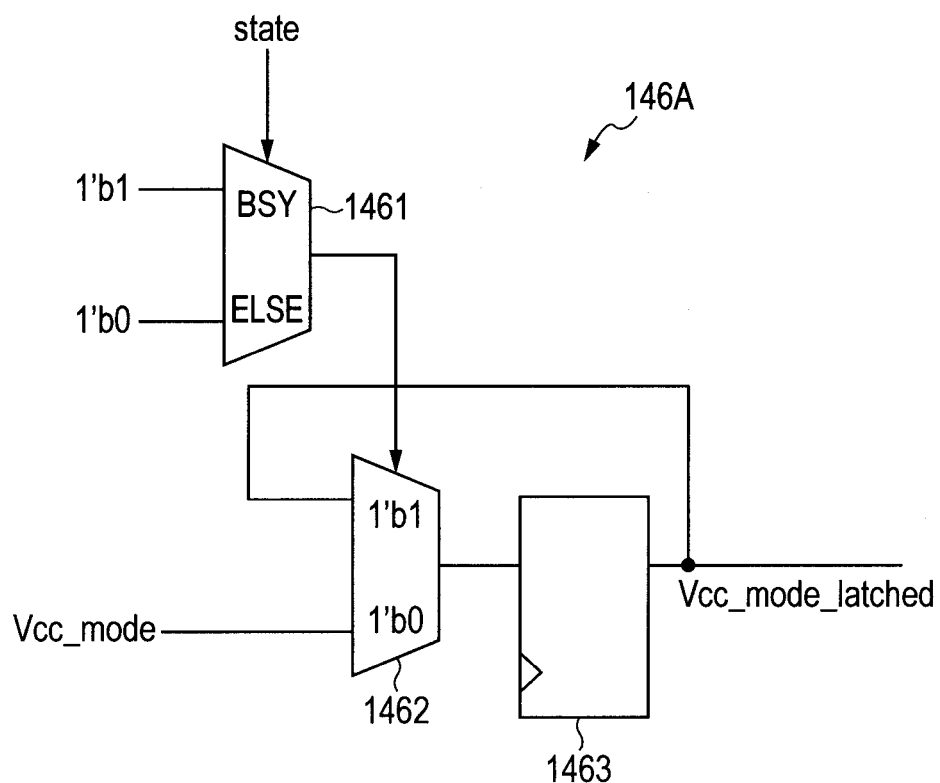
FIG. 4 is a circuit diagram illustrating an example of a configuration of a Vcc_mode holding circuit included in the microcomputer illustrated in FIG. 1.

It is necessary to switch each state length of the sub sequencer 145 corresponding to the Vcc mode. State transitions also differ corresponding to the Vcc mode. Accordingly, when the Vcc mode changes in the middle of each state, there is a possibility of device destruction due to malfunction of the timer and an unexpected voltage condition in the power supply and the distributor. In order to prevent such a situation, what is necessary is just not to transfer to the sub sequencer 145 a logic change of the Vcc_mode transferred from the main sequencer 13, during control periods such as a write/erase/verify in the sub sequencer 145. In order to realize this, it is sufficient to provide a Vcc_mode holding circuit for holding the Vcc_mode transferred from the main sequencer 13 in the Vcc analyzer 146. FIG. 4 illustrates an example of a configuration of the Vcc_mode holding circuit. The Vcc_mode holding circuit 146A in the Vcc analyzer 146 includes selectors 1461 and 1462 and a flip-flop 1463. Whether the sub sequencer 145 is controlling a write/erase/verify is transferred to the Vcc analyzer 146 by a signal State from the sub sequencer 145. When the sub sequencer 145 is controlling a write/erase/verify, the signal State indicates a busy (BSY) state. The selector 1461 selects "1'b1" or "1'b0", according to whether the signal State from the sub sequencer 145 indicates a busy "BSY" or not. When the output of the selector 1461 is "1'b0", the selector 1462 transfers the logical value of the Vcc_mode to the flip-flop 1463 selectively. When the output of the selector 1461 is "1'b1", the selector 1462 returns the output of the flip-flop 1463 to the input of the flip-flop concerned, thereby maintaining the flip-flop 1463 in a holding state. That is, the logical value of Vcc_mode_latched is fixed. The present holding state is maintained until the signal State indicates a state where the sub sequencer 145 is not controlling a write/erase/verify.

Figure 5:
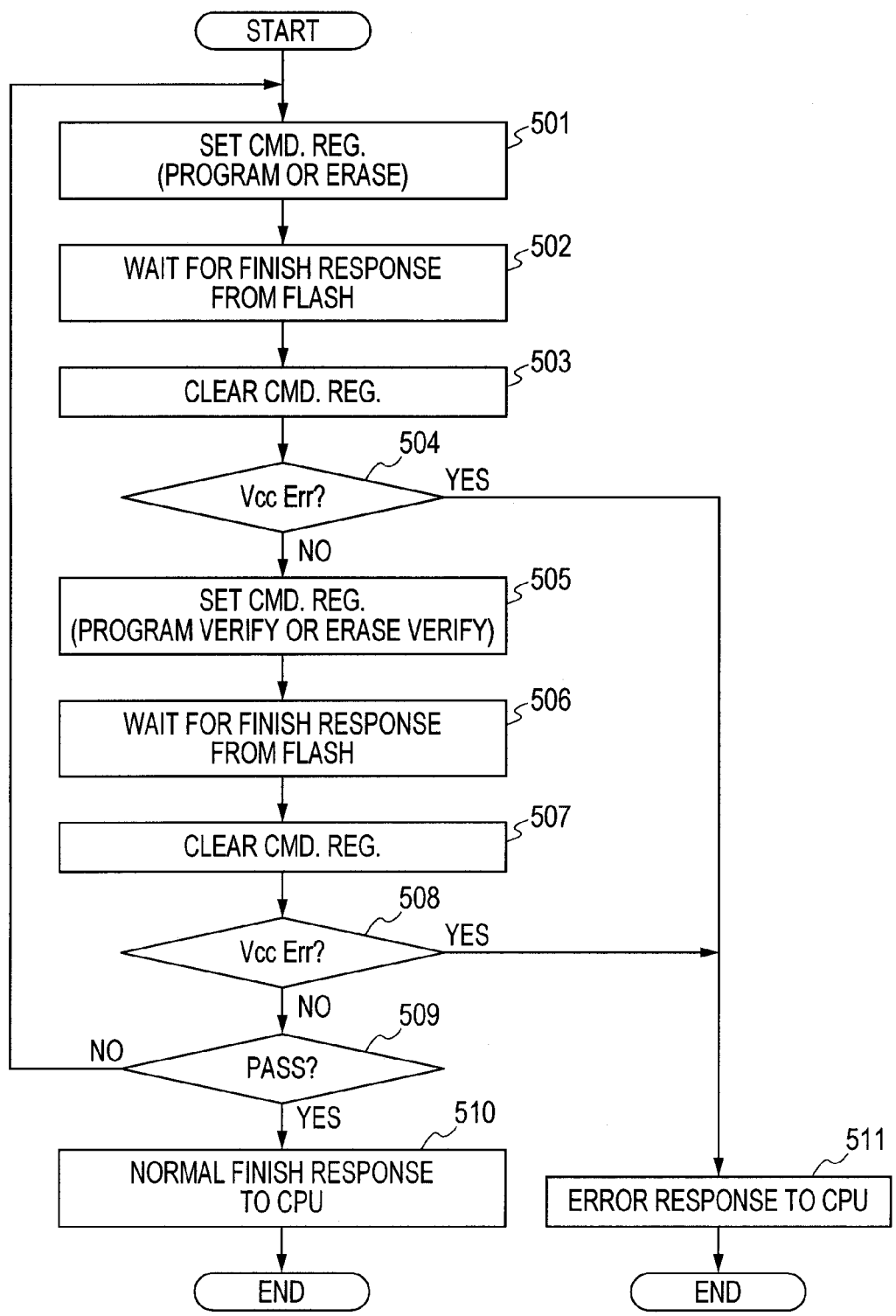
FIG. 5 is a flow chart illustrating major processing in a main sequencer included in the microcomputer illustrated in FIG. 1.

FIG. 5 illustrates a flow chart of major processing in the main sequencer 13.

When a write (or erase) command is transferred from the CPU 11, the main sequencer 13 sets up the command register 133 corresponding to the command (S501), and waits for a finish response from the flash memory 14 (S502). Corresponding to the setting contents of the command register 133, the sub sequencer 145 in the flash memory 14 performs a write (or erase) control of the flash memory array 149. When the write (or erase) is completed, the sub sequencer 145 returns a finish response to the main sequencer 13. Upon receiving the finish response from the sub sequencer 145, the main sequencer 13 clears the command register 133 (S503). Subsequently, based on the logical value of an error signal Vcc_err, the main sequencer 13 determines whether a Vcc error is detected by the Vcc analyzer 146 (S504). When the error signal Vcc_err is asserted by the Vcc analyzer 146, the main sequencer 13 determines that the Vcc error is generated (Y), and returns a Vcc error status to the CPU 11 via the status register 131 (S511). When the error signal Vcc_err is not asserted by the Vcc analyzer 146, the main sequencer 13 determines that a Vcc error is not generated (N), and sets a write verify command (or erase verify command) to the command register 133, in order to check whether a threshold value Vth of a flash memory has reached a write level (or erase level) (S505). Subsequently, the main sequencer 13 waits for a finish response from the flash memory 14 (S506). The sub sequencer 145 in the flash memory 14 performs a write verify (or erase verify) of the flash memory array 149 corresponding to the setting contents of the command register 133, and the sub sequencer 145 returns a finish response to the main sequencer 13 when the write verify (or erase verify) is completed. Upon receiving the finish response from the sub sequencer 145, the main sequencer 13 clears the command register 133 (S507). Subsequently, based on the logical value of an error signal Vcc_err, the main sequencer 13 determines whether a Vcc error is detected by the Vcc analyzer 146 (S508). When the error signal Vcc_err is asserted by the Vcc analyzer 146, the main sequencer 13 determines that the Vcc error is generated (Y), and returns a Vcc error status to the CPU 11 (S511). When the error signal Vcc_err is not asserted by the Vcc analyzer 146, the main sequencer 13 determines that a Vcc error is not generated (N). Based on the result of a write verify (or erase verify) of the flash memory array 149, the main sequencer 13 determines whether a threshold value Vth of a flash memory has reached a desired level (S509). When the present determination indicates that the threshold value Vth of the flash memory has reached the desired level (Y), the main sequencer 13 returns a finish status to the CPU 11 (S510). When the main sequencer 13 determines, in the determination at the step S509, that the threshold value Vth of the flash memory has not reached the desired level (N), the sequencer 13 returns to the processing at the step S501, sets up the command register 133 in order to execute a write (or erase) again (S501), and waits for a finish response from the flash memory 14 (S502). From this point onward, a write (or erase) and a write verify (or erase verify) are repeated until the threshold value Vth of the flash memory is determined to have reached the desired level (Y) in the determination at the step S509.

Figure 6:
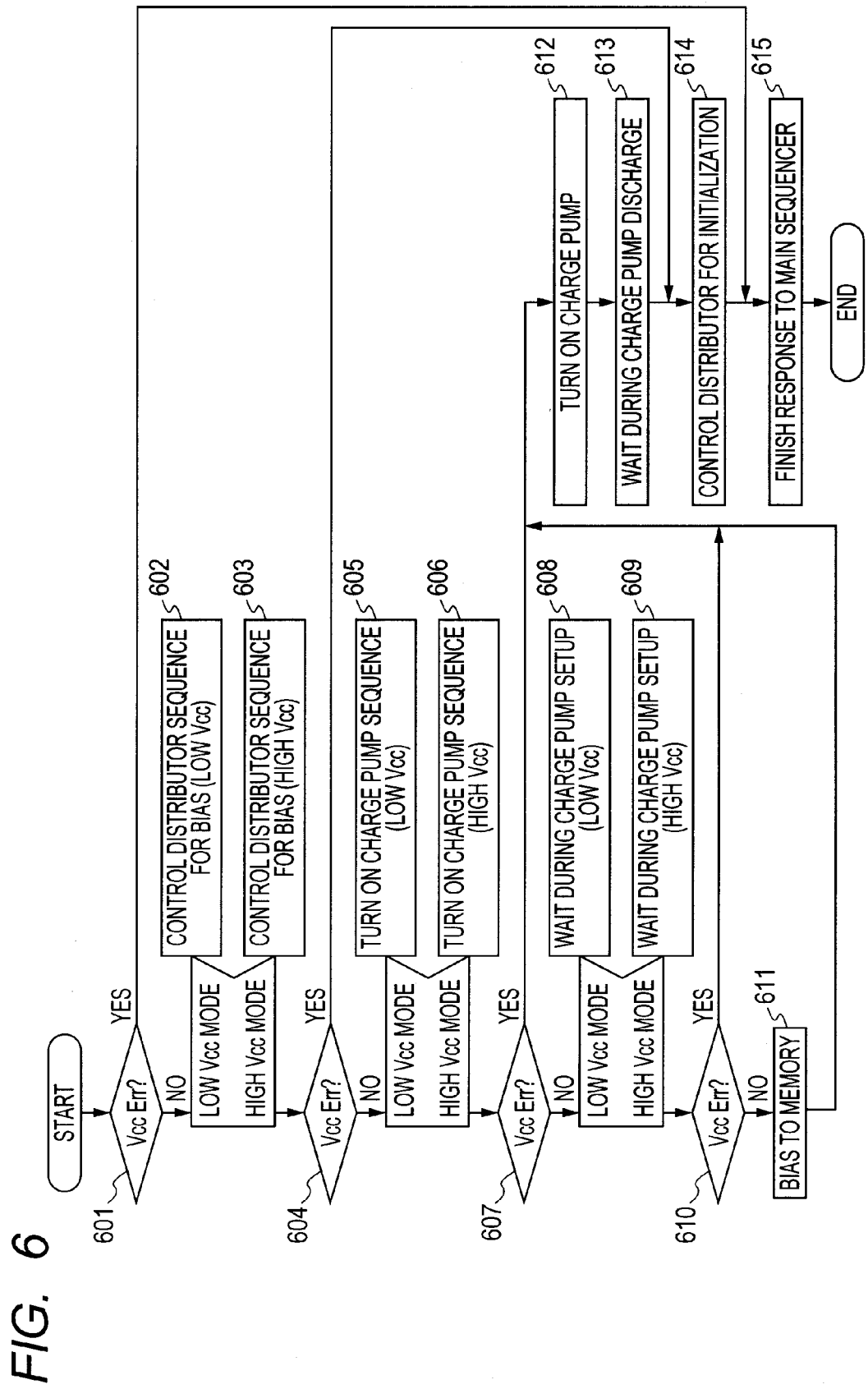
FIG. 6 is a flow chart illustrating major processing in a sub sequencer included in the microcomputer illustrated in FIG. 1.

FIG. 6 illustrates a flow chart of major processing in the sub sequencer 145.

When the command register 133 in the main sequencer 13 is set up, the sub sequencer 145 controls processing corresponding to the set-up command.

Based on the logical value of an error signal Vcc_err, the sub sequencer 145 determines whether a Vcc error is detected by the Vcc analyzer 146 (S601). When the error signal Vcc_err is not asserted by the Vcc analyzer 146, the sub sequencer 145 determines that a Vcc error is not detected (N), and controls the sequence of the distributor 151 according to the Vcc mode. That is, when the low Vcc mode is instructed by the Vcc analyzer 146, voltage selection for bias application corresponding to the low Vcc mode is performed, by controlling the distributor 151 (S602), and when the high Vcc mode is instructed by the Vcc analyzer 146, voltage selection for bias application corresponding to the high Vcc mode is performed, by controlling the distributor 151 (S603).

Subsequently, based on the logical value of the error signal Vcc_err again, the sub sequencer 145 determines whether a Vcc error is detected by the Vcc analyzer 146 (S604). When an error signal Vcc_err is not asserted by the Vcc analyzer 146, the sub sequencer 145 determines that a Vcc error is not detected (N), and the charge pump is activated corresponding to the Vcc mode. When the low Vcc mode is instructed by the Vcc analyzer 146, the distributor 151 is controlled and charge pump control corresponding to the low Vcc mode is performed (S605). When the high Vcc mode is instructed by the Vcc analyzer 146, a charge pump corresponding to the high Vcc mode is activated (S606).

After the activation of the charge pump, the sub sequencer 145 determines whether a Vcc error is detected by the Vcc analyzer 146, based on the logical value of the error signal Vcc_err again (S607). When an error signal Vcc_err is not asserted by the Vcc analyzer 146, the sub sequencer 145 determines that a Vcc error is not detected (N), and waits for completion of a setup of the charge pump corresponding to the Vcc mode. It is necessary to wait until the output of the charge pump reaches a predetermined voltage level. When the low Vcc mode is instructed by the Vcc analyzer 146, the sub sequencer 145 waits for the completion of the setup of the charge pump corresponding to the low Vcc mode (S608). When the high Vcc mode is instructed by the Vcc analyzer 146, the sub sequencer 145 waits for the completion of the setup of the charge pump corresponding to the high Vcc mode (S609).

After the completion of the setup of the charge pump, the sub sequencer 145 determines whether a Vcc error is detected by the Vcc analyzer 146, based on the logical value of the error signal Vcc_err again (S610). When an error signal Vcc_err is not asserted by the Vcc analyzer 146, the sub sequencer 145 determines that a Vcc error is not detected (N), and voltage supply for bias is performed via the distributor 151 (S611).

Then the charge pump is turned off (S612). After a charge of the charge pump has been discharged (S613), the distributor 151 is initialized (S614) and a finish response is transferred to the main sequencer 13 (S615).

In the determination at the step S601, when an error signal Vcc_err is asserted by the Vcc analyzer 146, the sub sequencer 145 determines that a Vcc error is detected (Y), and a finish response is transferred to the main sequencer 13 (S615).

In the determination at the step S604, when an error signal Vcc_err is asserted by the Vcc analyzer 146, the sub sequencer 145 determines that a Vcc error is detected (Y), and the distributor 151 is initialized (S614).

When an error signal Vcc_err is asserted by the Vcc analyzer 146 in the determination at the step S607, or when an error signal Vcc_err is asserted by the Vcc analyzer 146 in the determination at the step S610, the sub sequencer 145 determines that a Vcc error is detected (Y), and the charge pump is turned off (S612).

Each state of the sub sequencer 145 is switched corresponding to the power supply voltage mode, and state transitions also differ corresponding to the power supply voltage mode. When voltage selection corresponding to the high Vcc mode is performed, a high-speed operation becomes possible, compared with a case where voltage selection corresponding to the low Vcc mode is performed; accordingly, a write and an erase to the flash memory array 149 can be completed in a short time.

Figures 7A, 7B:
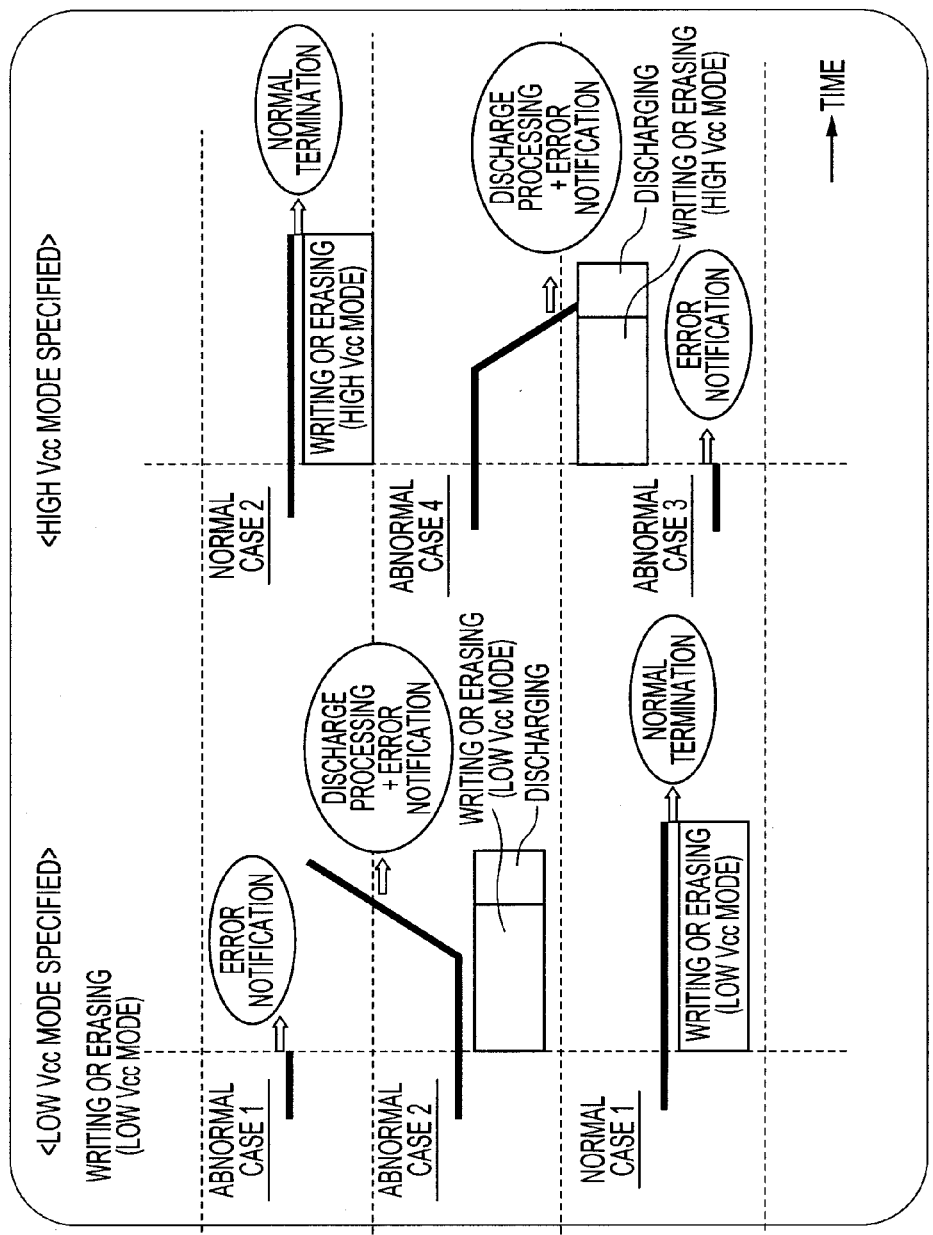
FIG. 7(A) and FIG. 7(B) are an explanatory diagram illustrating relation between an appropriate range of a high-potential-side power source voltage Vcc and a Vcc mode specification.

FIG. 7(A) and FIG. 7(B) illustrate relation between an appropriate range of a high-potential-side power source voltage Vcc and a Vcc mode specification.

FIG. 7(A) illustrates a range supported by Vcc, a range in need of control corresponding to the low Vcc mode, and a range in need of control corresponding to the high Vcc mode.

The range supported by Vcc is equal to or greater than Vccmin and equal to or less than Vccmax. When Vcc is equal to or greater than Vccmin and equal to or less than VccLmax, control corresponding to the low Vcc mode is necessary. If control corresponding to the low Vcc mode is performed when Vcc is higher than VccLmax, an excessive step-up occurs, leading to device destruction. When Vcc is equal to or greater than VccHmin and equal to or less than Vccmax, control corresponding to the high Vcc mode is necessary. If control corresponding to the high Vcc mode is performed when Vcc is lower than VccHmin, a necessary step-up level is not reached, leading to impracticability of a write or an erase.

Control in the low Vcc mode and the high Vcc mode is performed as illustrated in FIG. 7(B). In FIG. 7 (B), the horizontal axis is time.

The Vcc mode (low Vcc mode/high Vcc mode) is set to the Vcc mode register 132 in the main sequencer 13 by a user.

When the low Vcc mode is set to the Vcc mode register 132 and when Vcc is equal to or greater than Vccmin and equal to or less than VccLmax from start of a write/erase to end of the write/erase, the write/erase is performed by the low Vcc mode, with a normal termination (normal case 1).

When the low Vcc mode is set to the Vcc mode register 132 and when Vcc exceeds VccLmax at the time of start of a write/erase, a Vcc mismatch is detected by the Vcc analyzer 146 and an error signal Vcc_err is asserted. In the present case, the generation of a Vcc error is determined at the step S504 or at the step S508 in FIG. 5, and a Vcc error status (error notification) is returned to the CPU 11 via the status register 131. In the case, the error notification to the CPU 11 is only performed, and a write/erase is not performed (abnormal case 1)

When the low Vcc mode is set to the Vcc mode register 132 and when Vcc exceeds VccLmax during a write/erase, the generation of a Vcc error is determined at the step S607 or at the step S610 in FIG. 6, then, the charge pump is turned off (S612), and after a charge of the charge pump has been discharged (S613), the distributor 151 is initialized (S614), and a finish response is transferred to the main sequencer 13 (S615). A Vcc error status (error notification) is returned to the CPU 11 via the status register 131 (abnormal case 2).

When the high Vcc mode is set to the Vcc mode register 132 and when Vcc is equal to or greater than VccHmin and equal to or less than Vccmax from start of a write/erase to end of the write/erase, the write/erase is performed by the high Vcc mode, with a normal termination (normal case 2).

When the high Vcc mode is set to the Vcc mode register 132 and when Vcc is lower than VccHmin at the time of start of a write/erase, a Vcc mismatch is detected by the Vcc analyzer 146 and an error signal Vcc_err is asserted. In the present case, the generation of a Vcc error is determined at the step S504 or at the step S508 in FIG. 5, and a Vcc error status (error notification) is returned to the CPU 11 via the status register 131. The write/erase is not started (abnormal case 3).

When the high Vcc mode is set to the Vcc mode register 132 and when Vcc becomes lower than VccHmin during a write/erase, the generation of a Vcc error is determined at the step S607 or at the step S610 in FIG. 6, then, the charge pump is turned off (S612), and after a charge of the charge pump has been discharged (S613), the distributor 151 is initialized (S614), and a finish response is transferred to the main sequencer 13 (S615). A Vcc error status (error notification) is returned to the CPU 11 via the status register 131 (abnormal case 4).

Here, in the abnormal case 3 or the abnormal case 4, if control is continued in the high Vcc mode, a necessary step-up level is not reached; accordingly, a write/erase is not performed normally. However, device destruction does not occur. Therefore, in the case of the abnormal case 3 or the abnormal case 4, it may be also preferable to continue control after changing from the high Vcc mode theretofore to the low Vcc mode in the Vcc analyzer 146, without performing the discharge processing etc.

According to First Embodiment, the following working-effects are obtained.

(1) Since the control sequence of the distributor and the charge pump is switched according to the Vcc mode and the latency time is also switched according to the Vcc mode, neither an excessive step-up nor a shortage of a step-up will occur as far as the power supply voltage Vcc is in a suitable range to the Vcc mode. Accordingly, it is possible to realize operational stability of the nonvolatile memory in plural power supply voltage modes set up in advance corresponding to the power supply voltage level.

(2) When a user has specified the low Vcc mode and an error notification of a Vcc mismatch is received (abnormal case 1, abnormal case 2), it is possible to perform a write/erase normally, by specifying anew the high Vcc mode and redoing a write/erase again. Similarly, when a user has specified the high Vcc mode and an error notification of a Vcc mismatch is received (abnormal case 3, abnormal case 4), it is possible to perform a write/erase normally, by specifying anew the low Vcc mode and redoing a write/erase again. That is, it is possible to perform a write/erase for Vcc from Vccmin to Vccmax.

(3) Since the Vcc_mode holding circuit for holding a Vcc_mode transferred from the main sequencer 13 is provided in the Vcc analyzer 146, a change of a logical value of the Vcc_mode which is transferred from the main sequencer 13 is not transferred to the sub sequencer 145, while the sub sequencer 145 is in control periods of a write/erase/verify. Accordingly, it is possible to prevent that the power supply voltage mode changes during a write or an erase (including a verify). ° Accordingly, it is possible to prevent a circuit malfunction and to secure the reliability of a verify.

(4) The reliability of the flash memory 14 can be improved by the working-effects of (1)-(3) described above. It is also possible to attain improvement in the reliability of the microcomputer 10 which is provided with the flash memory 14 as described above.

Second Embodiment

In First Embodiment, when a Vcc mismatch occurs, an error is notified, and a user specifies anew a Vcc mode, upon seeing the notice; accordingly support from Vccmin to Vccmax is realized. In Second Embodiment, on the other hand, support from Vccmin to Vccmax is realized without specifying anew a Vcc mode.

Figure 8:
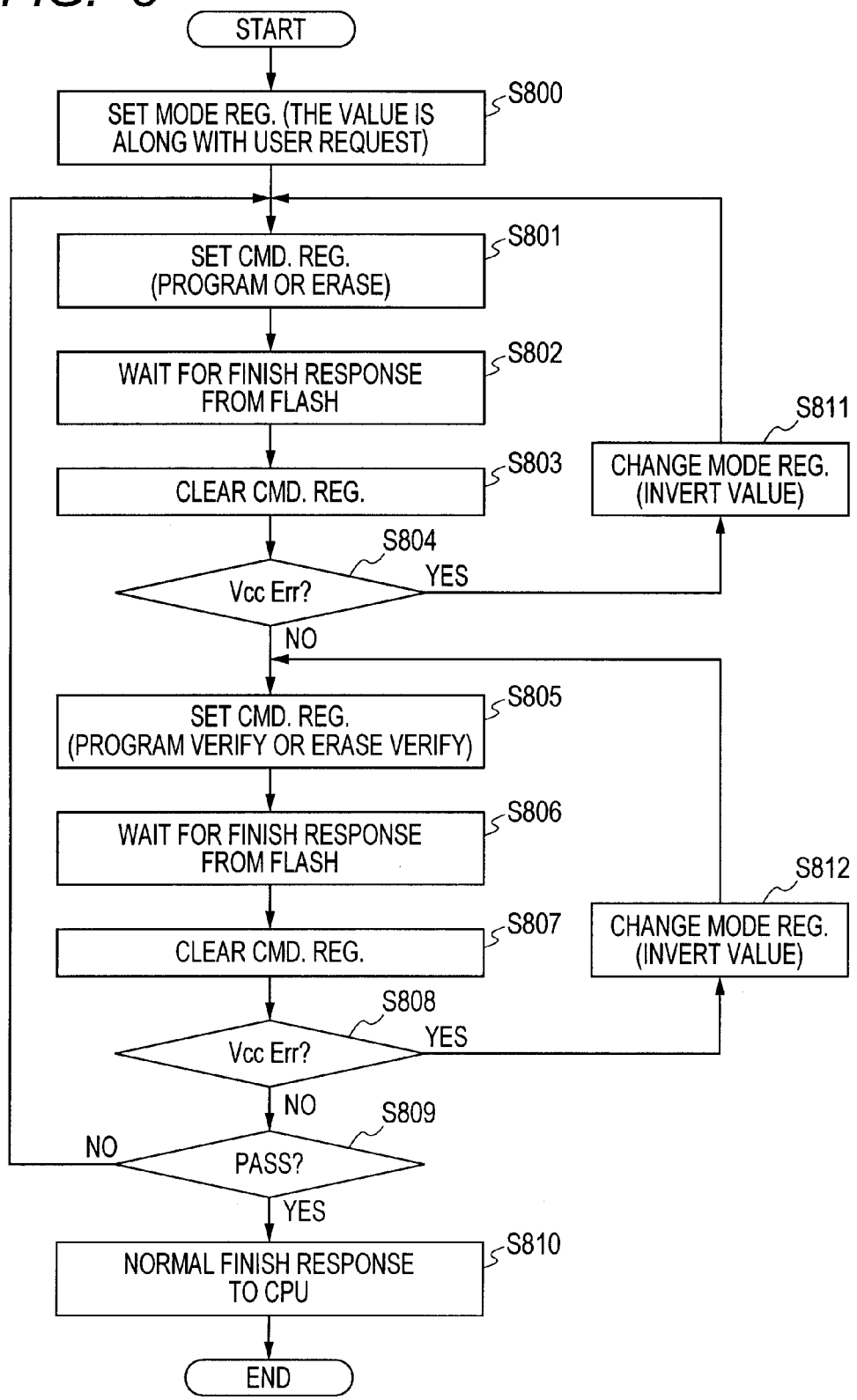
FIG. 8 is a flow chart illustrating major processing in a main sequencer included in another example of a configuration of a microcomputer according to the present invention.

FIG. 8 illustrates a flow chart of major processing in the main sequencer 13.

The flow chart of the major processing illustrated in FIG. 8 is greatly different from the counterpart illustrated in FIG. 5, in that the flow returns to the setup of the command register 133, after changing the setting contents of the mode register 132 at the steps S811 and S812.

At the step S800, initial setting of the mode register 132 is performed according to a user's request. The steps S801-S810 correspond to the steps S501-S510 illustrated in FIG. 5.

Figure 9:
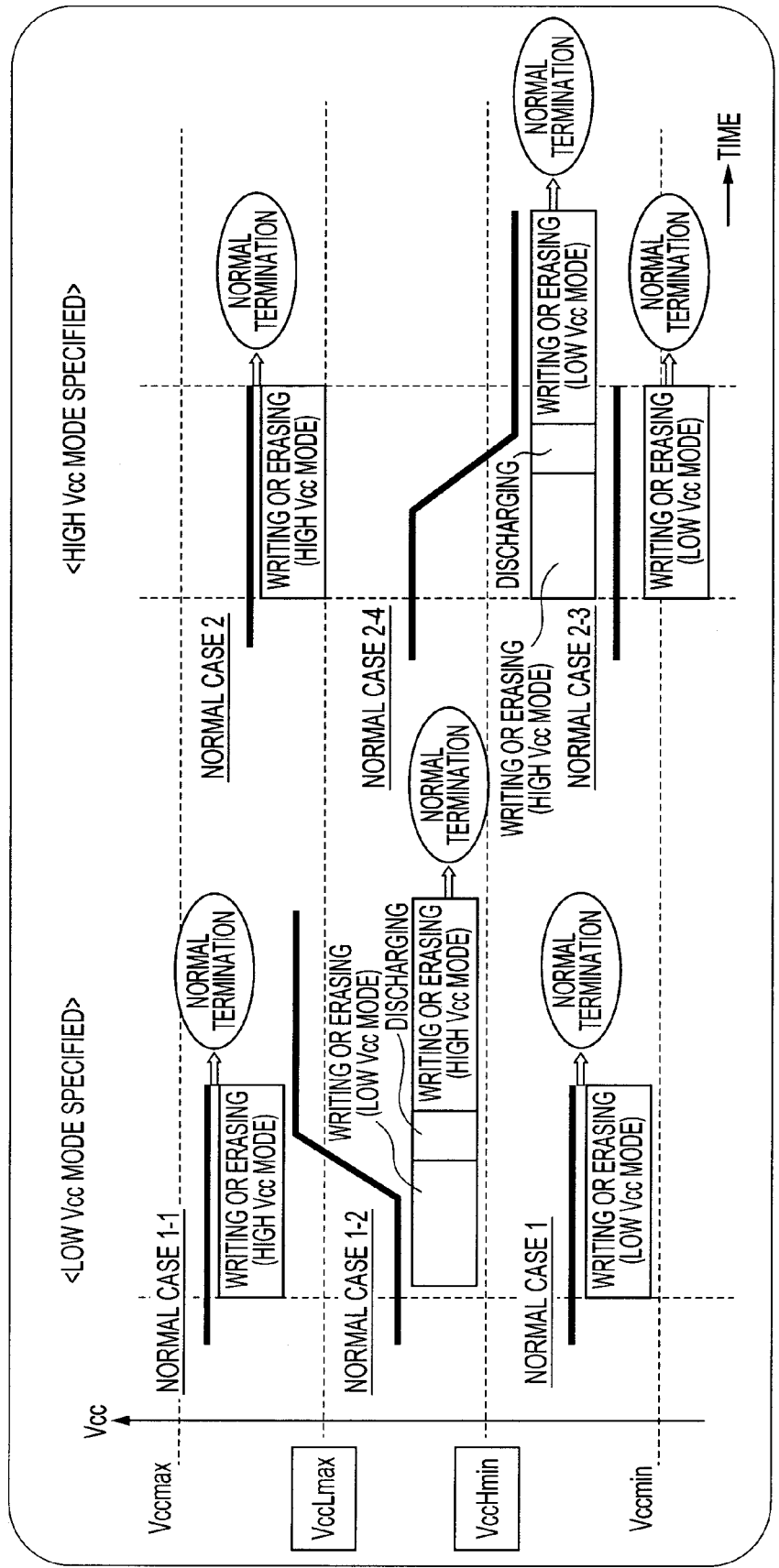
FIG. 9 is an explanatory diagram illustrating another relation between an appropriate range of a high-potential-side power source voltage Vcc and a Vcc mode specification.

FIG. 9 illustrates relation between an appropriate range of the high-potential-side power source voltage Vcc and the Vcc mode specification. In FIG. 9, the horizontal axis is time.

The initial value of the Vcc mode (low Vcc mode/high Vcc mode) is set to the Vcc mode register of the main sequencer by a user as is the case with First Embodiment.

When the low Vcc mode is set by a user and when Vcc is equal to or greater than Vccmin and equal to or less than VccLmax, from start of a write/erase to end of the write/erase, the write/erase is performed by the low Vcc mode control, with a normal termination (normal case 1).

When the low Vcc mode is set by a user and when Vcc exceeds VccLmax at the time of start of a write/erase, the main sequencer changes the Vcc mode register to the high Vcc mode and performs a write/erase, with a normal termination (normal case 1-1).

When the low Vcc mode is set by a user and when Vcc exceeds VccLmax during a write/erase, after performing discharge processing, the main sequencer changes the Vcc mode register to the high Vcc mode and performs a write/erase again, with a normal termination (normal case 1-2).

When the high Vcc mode is set by a user and when Vcc is equal to or greater than VccHmin and equal to or less than Vccmax from start of a write/erase to end of the write/erase, the write/erase is performed by the high Vcc mode, with a normal termination (normal case 2).

When the high Vcc mode is set by a user and when Vcc is lower than VccHmin at the time of start of a write/erase, the main sequencer changes the Vcc mode register to the low Vcc mode and performs a write/erase, with a normal termination (normal case 2-3).

When the high Vcc modal control is set by a user and when Vcc becomes lower than VccHmin during a write/erase, after performing discharge processing, the main sequencer changes the Vcc mode register to the low Vcc mode and performs a write/erase again, with a normal termination (normal case 2-4).

According to Second Embodiment, the following characteristic working-effects are obtained.

In First Embodiment, when a Vcc mismatch occurs, an error is notified, and a user specifies anew a Vcc mode which the user has specified; accordingly support from Vccmin to Vccmax is realized. In Second Embodiment, on the other hand, support from Vccmin to Vccmax can be realized without the user specifying anew a Vcc mode.

Third Embodiment

In First Embodiment and Second Embodiment, a user specifies a Vcc mode or an initial value of a Vcc mode. However, as will be described below, it is also possible to configure a circuit so that a Vcc mode may be automatically determined corresponding to a detection level of the high-potential-side power source voltage Vcc.

Figure 10:
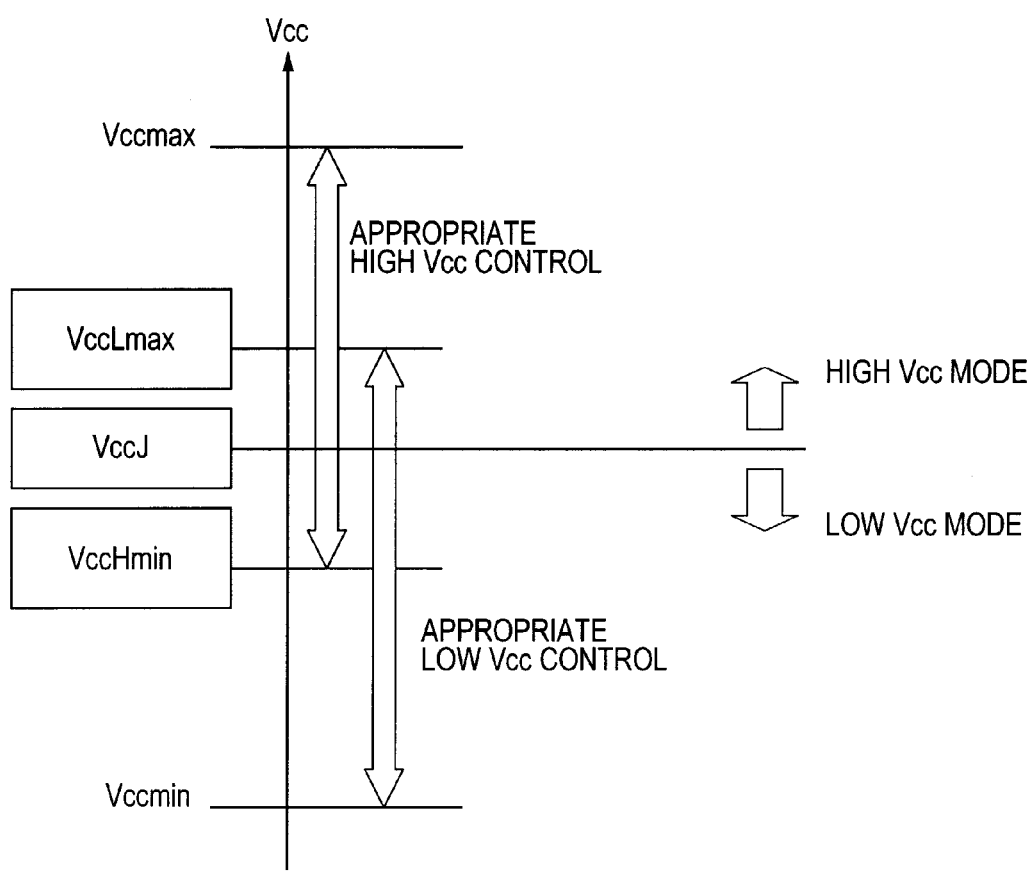
FIG. 10 is an explanatory diagram illustrating an example of determining of a Vcc mode.

For example, as illustrated in FIG. 10, a reference level VccJ for determining a Vcc mode is set up. VccJ is set up higher than VccHmin and lower than VccLmax. What is necessary is just to configure a circuit so that a Vcc mode is determined, at the time of start of a write/erase, as the low Vcc mode when the high-potential-side power source voltage Vcc is lower than VccJ, and as the high Vcc mode when the high-potential-side power source voltage Vcc is equal to or greater than VccJ.

Figure 11:
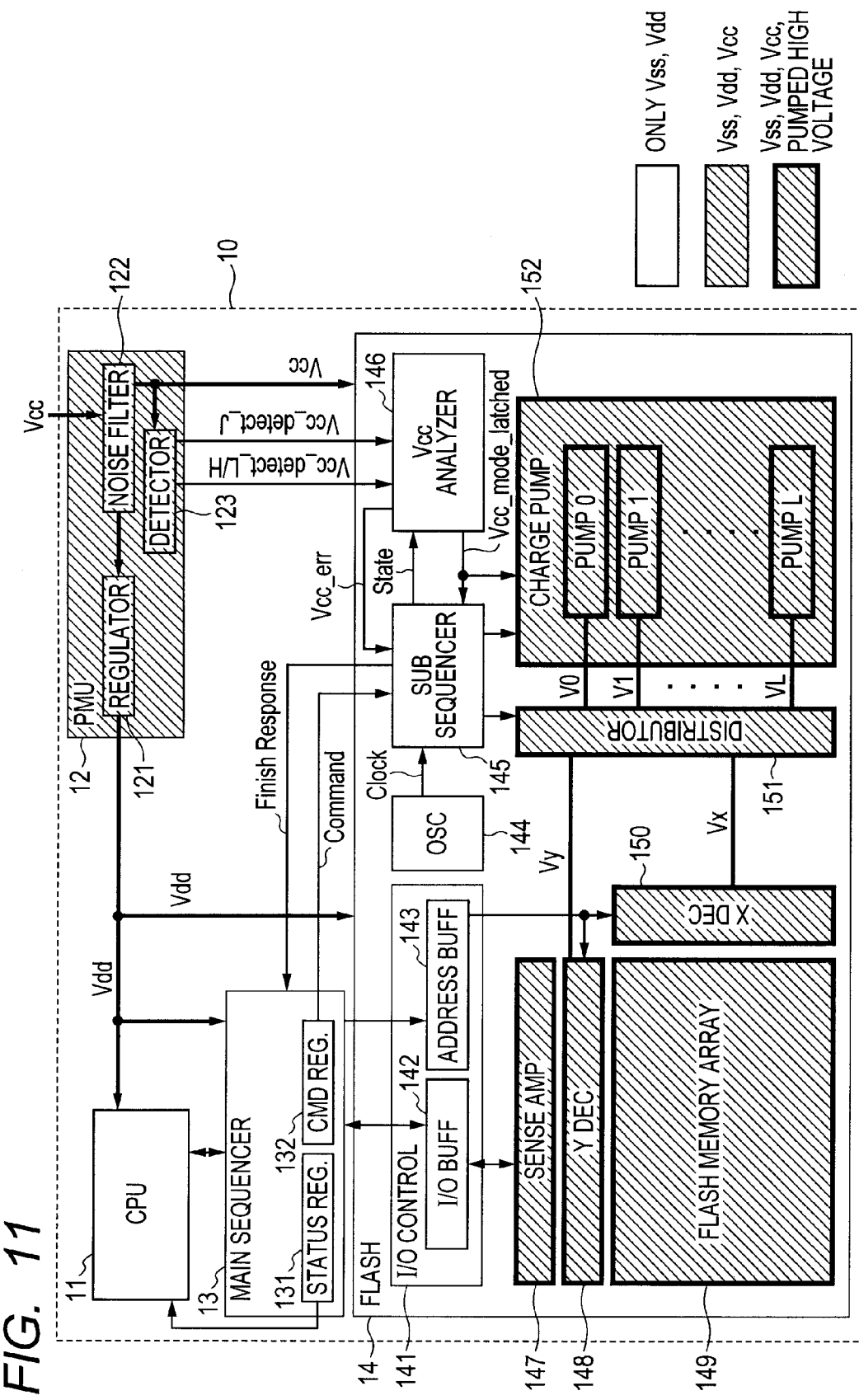
FIG. 11 is a block diagram illustrating another example of a configuration of a microcomputer as an example of a data processing apparatus according to the present invention.

FIG. 11 illustrates a block diagram of a microcomputer which can determine a Vcc mode automatically, corresponding to a detection level of the high-potential-side power source voltage Vcc. The microcomputer 10 illustrated in FIG. 11 is greatly different from the microcomputer illustrated in FIG. 1, in that, in addition to Vcc_detect_L/H, Vcc_detect_J is transferred from the power management unit 12 to the Vcc analyzer 146. In the present embodiment, since a Vcc mode is determined automatically, an element which corresponds to the mode register 132 illustrated in FIG. 1 is omitted.

A logical value of Vcc_detect_J is determined in the detector 123 of the power management unit 12 according to a truth table illustrated in FIG. 12. That is, the detector 123 sets Vcc_detect_J to "L" (low level) when the high-potential-side power source voltage Vcc is lower than VccJ, and sets Vcc_detect_J to "H" (high level) when the high-potential-side power source voltage Vcc is equal to or greater than VccJ.

The Vcc analyzer 146 latches Vcc_detect_J transferred and generates a signal Vcc_mode_latched. A Vcc_mode_latched generating circuit is illustrated in FIG. 4 as is the case with the embodiments explained so far. However, Vcc_detect_J is coupled instead of Vcc_mode illustrated in FIG. 4. As illustrated in FIG. 13, the Vcc analyzer 146 sets Vcc_mode_latched to "L" (low level) when Vcc_detect_J is at a low level, and sets Vcc_mode_latched to "H" (high level) when Vcc_detect_J is at a high level. However, as is the case with the embodiments explained so far, a state where the sub sequencer 145 is not controlling a write/erase/verify is held until the holding state is indicated by the signal State.

The Vcc analyzer 146 checks the matching among Vcc_mode_latched, Vcc_detect_L, and Vcc_detect_H. When a mismatch occurs, the Vcc analyzer 146 asserts an error signal Vcc_err to the main sequencer 13. The output logic of a Vcc matching confirmatory result in the Vcc analyzer 146 is determined based on a truth table of FIG. 3. When a mismatch occurs in Vcc_mode_latched, Vcc_detect_H, and Vcc_detect_L, Vcc_err is asserted to a high level (H) by the Vcc analyzer 146. For example, since a mismatch is present when the detection results Vcc_detect_H and Vcc_detect_L are "L" and "L" (Vcc<VccHmin), in spite of the fact that Vcc_mode_latched is set as "H." Therefore, Vcc_err is asserted to a high level (H) by the Vcc analyzer 146. A mismatch is also present when the detection result Vcc_detect_H and Vcc_detect_L are "H" and "H" (Vccmax≦Vcc), in spite of the fact that Vcc_mode_latched is set as "L." Therefore, Vcc_err is asserted to a high level (H) by the Vcc analyzer 146. The logical value of Vcc_err is held by the Vcc analyzer 146 until it is cleared by the main sequencer 13. When matching is obtained in Vcc_mode_latched, Vcc_detect_H, and Vcc_detect_L, Vcc_err is negated to a low level (L).

Figure 14:
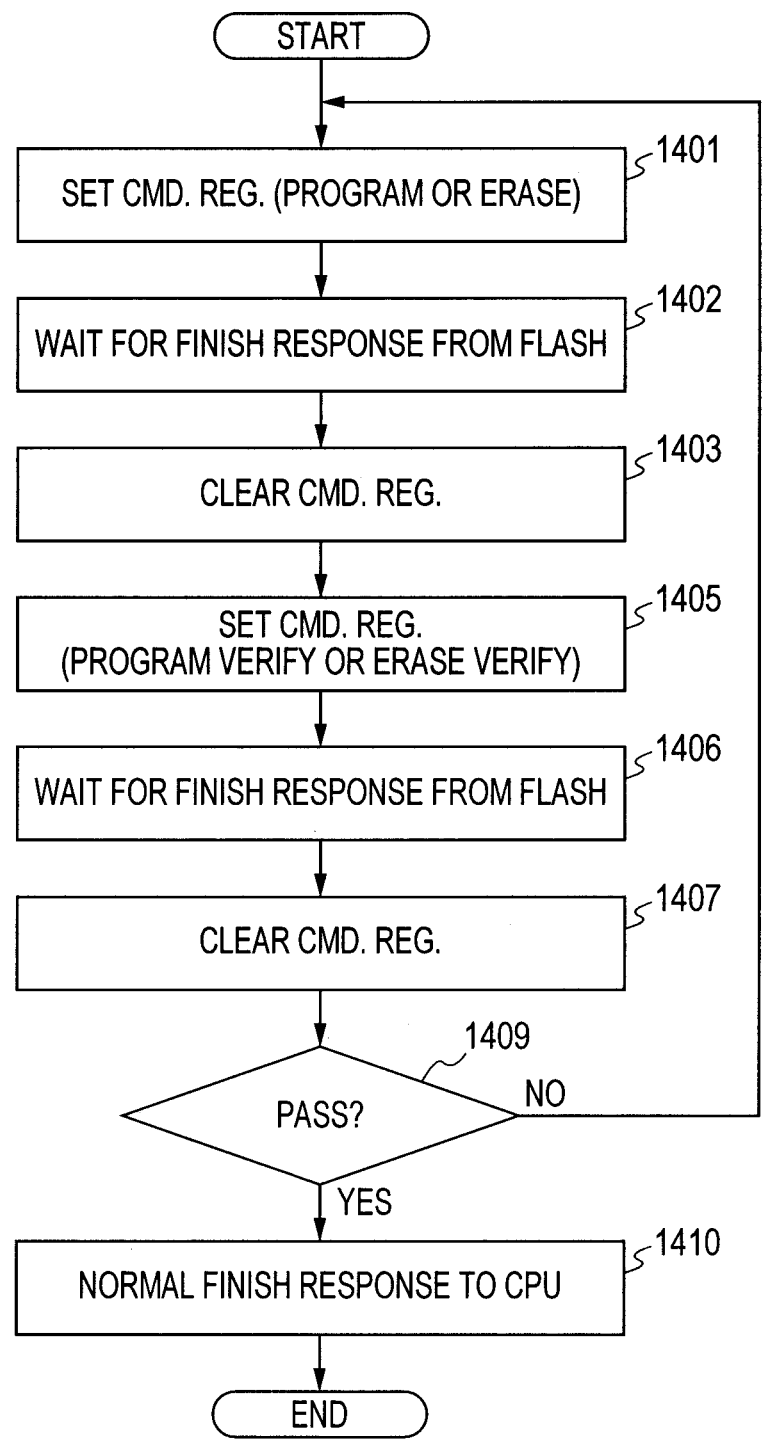
FIG. 14 is a flow chart illustrating major processing in a main sequencer included in the microcomputer illustrated in FIG. 11.

FIG. 14 illustrates a flow chart of major processing in the main sequencer 13 illustrated in FIG. 11.

The flow chart illustrated in FIG. 14 is greatly different from the flow chart illustrated in FIG. 5, in terms of omitting processing which corresponds to the Vcc error determination at the steps S504 and S508 and which corresponds to the processing for returning the Vcc error status to the CPU 11 at the step S511.

Processing at the steps S1401-S1403 illustrated in FIG. 14 corresponds to the processing at the steps S501-S503 illustrated in FIG. 5. Processing at the steps S1405-S1407 illustrated in FIG. 14 corresponds to the processing at the steps S505-S507 illustrated in FIG. 5. Processing at the steps S1409 and S1410 illustrated in FIG. 14 corresponds to the processing at the steps S509 and S510 in FIG. 5.

Figure 15:
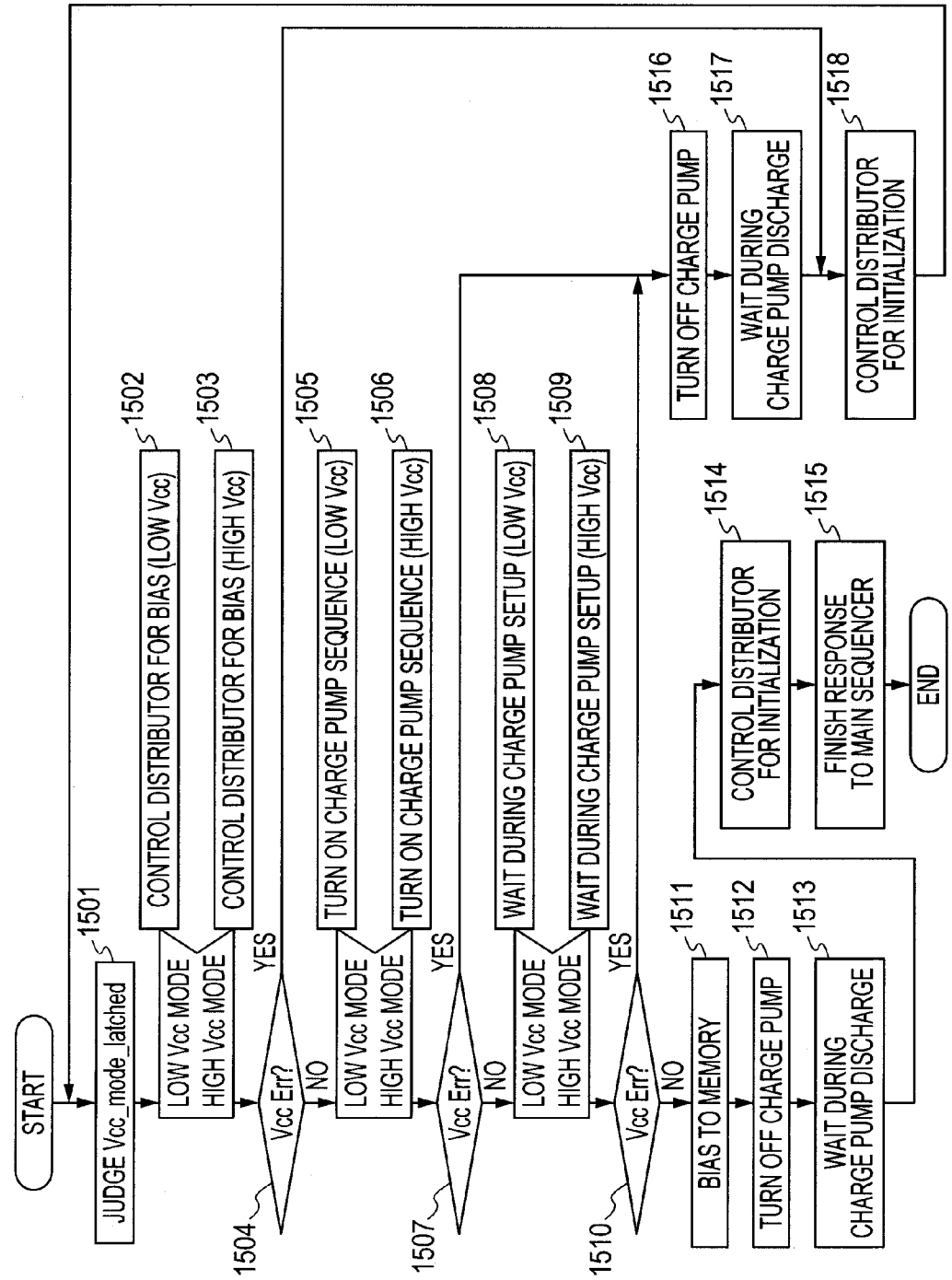
FIG. 15 is a flow chart illustrating major processing in a sub sequencer included in the microcomputer illustrated in FIG. 11.

FIG. 15 illustrates a flow chart of major processing in the sub sequencer 145 illustrated in FIG. 11.

The sub sequencer 145 illustrated in FIG. 11 determines a logical value of Vcc_mode_latched transferred from the Vcc analyzer 146 (S1501). When Vcc_mode_latched is at a low level, the low Vcc mode is set up, and when Vcc_mode_latched is at a high level, the high Vcc mode is set up. Processing at the steps S1502-S1515 illustrated in FIG. 15 is the same as the processing at the steps S602-S615 illustrated in FIG. 6. However, when it is determined that a Vcc error is detected (Y) in the determination at the step S1504, the distributor 151 is initialized (S1518) and the flow is returned to the logic judgment of Vcc_mode_latched at the step S1501. When it is determined that a Vcc error is detected (Y) in the determination at the steps S1507 and S1510, the charge pump is turned off (S1516). After a charge of the charge pump has been discharged (S1517), the distributor 151 is initialized (S1518). Then, the flow is returned to the logic judgment of Vcc_mode_latched at the step S1501, and the logic judgment of Vcc_mode_latched transferred from the Vcc analyzer 146 is performed again.

According to Third Embodiment, the following characteristic working-effects are obtained.

(1) Since the Vcc mode can be determined automatically corresponding to a detection level of the high-potential-side power source voltage Vcc, it is possible to realize support from Vccmin to Vccmax without the user specifying the Vcc mode.

(2) In addition to Vcc_detect_L/H, Vcc_detect_J is transferred from the power management unit 12 to the Vcc analyzer 146. The Vcc analyzer 146 is configured so as to generate Vcc_mode_latched by latching Vcc_detect_J, to check matching of Vcc_mode_latched, Vcc_detect_L, and Vcc_detect_H, and to assert an error signal Vcc_err when a mismatch occurs. Therefore, it is possible to attain improvement in the reliability of the flash memory 14. It is also possible to attain improvement in the reliability of the microcomputer 10 which is provided with the flash memory 14 as described above.

Fourth Embodiment

Figure 16:
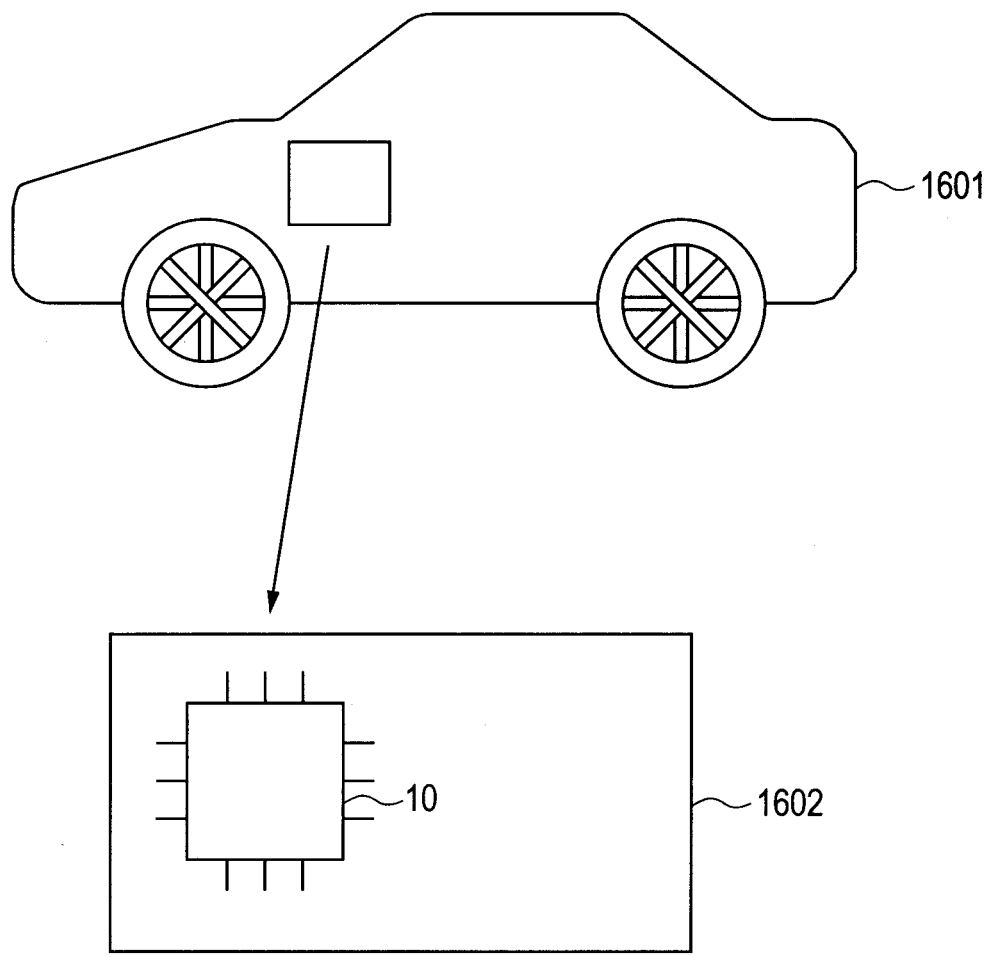
FIG. 16 is an explanatory diagram illustrating a microcomputer application system.

The microcomputer 10 according to First Embodiment-Third Embodiment is applicable to various microcomputer application systems. For example, as illustrated in FIG. 16, the microcomputer 10 is applicable to an engine control board 1602 of a vehicle 1601. In the applied microcomputer 10, a predetermined control program created for each of the microcomputer application systems is executed.

The engine control board 1602 is also called an engine control unit (ECU), and is mainly performing control of an ignition system and a fuel system in the vehicle 1601. In an automatic transmission vehicle, the engine control board 1602 also performs control of an entire power train including a transmission. The engine control board 1602 performs almost all control to an engine in some cases. In such an engine control board 1602, the microcomputer 10 according to First Embodiment-Third Embodiment is mounted.

Figure 17:
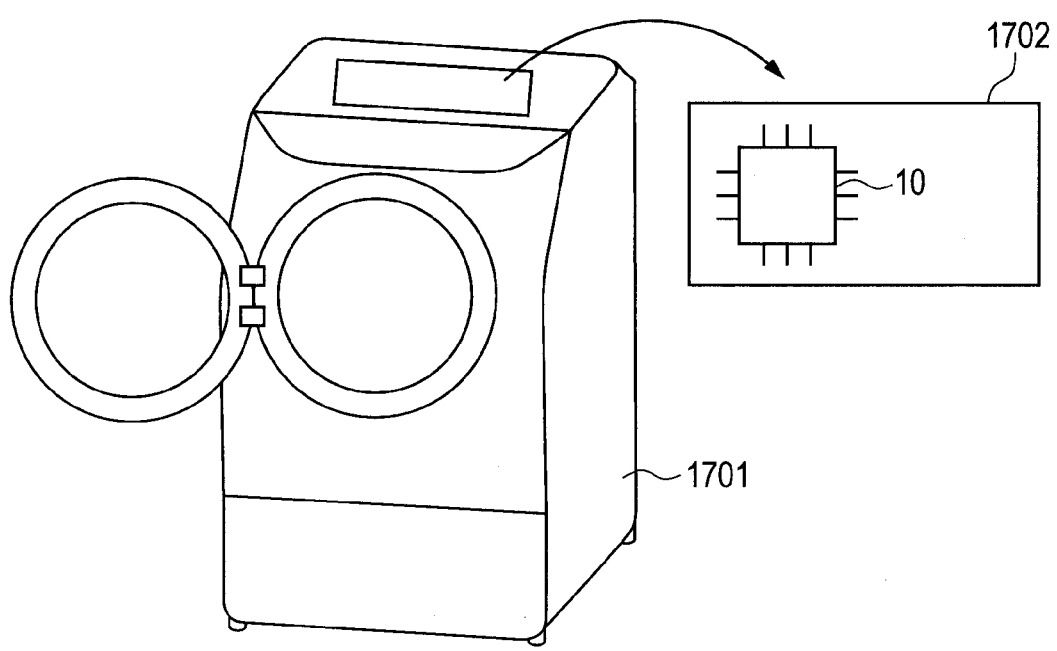
FIG. 17 is another explanatory diagram illustrating a microcomputer application system.

The microcomputer 10 according to First Embodiment-Third Embodiment is also applicable to a control board 1702 of a washing machine 1701 as an example of home electric appliances, as illustrated in FIG. 17. In the control board 1702, control of an inverter motor mounted in the washing machine is performed.

In the engine control board 1602 illustrated in FIG. 16, and the control board 1702 for home electric appliances illustrated in FIG. 17, it is possible to attain improvement in the reliability of the microcomputer application system owing to the reliability of the microcomputer 10 provided with the flash memory 14.

As described above, the invention accomplished by the present inventors has been concretely explained based on various embodiments. However, it cannot be overemphasized that the present invention is not restricted to the embodiments, and it can be changed variously in the range which does not deviate from the gist.

For example, the present invention can be applied even when the flash memory 14 is provided in the form of a discrete device as a nonvolatile memory.

What is claimed is:

1. A nonvolatile memory comprising:
a memory array in which nonvolatile memory cells are arranged;
    a charge pump operable to step up supplied power supply voltage, and to output the step-up voltage;
    a distributor operable to select an output voltage of the charge pump for data writing or an erase operation to the memory array;
    a sequencer operable to control operation of the charge pump and the distributor; and
    an analyzer operable to notify the sequencer of a power supply voltage mode selectively specified among a plurality of power supply voltage modes set up in advance corresponding to power supply voltage levels, operable to detect a mismatch between the power supply voltage mode notified to the sequencer and an actually supplied power supply voltage, and operable to limit the operation of the charge pump and the distributor with the use of the sequencer, based on the detection result.

2. The nonvolatile memory according to claim 1,
wherein the analyzer asserts an error signal which can limit the operation of the charge pump and the distributor with the use of the sequencer, based on the detection result of the mismatch between the power supply voltage mode notified to the sequencer and the actually supplied power supply voltage, and
wherein, when the analyzer asserts the error signal during a write or an erase to the memory array, the sequencer initializes the distributor after a charge of the charge pump has been discharged.

3. The nonvolatile memory according to claim 2,
wherein a write speed and an erase speed to the memory array change, corresponding to the power supply voltage mode notified to the sequencer by the analyzer.

4. The nonvolatile memory according to claim 3,
wherein the analyzer comprises a holding circuit operable to hold the power supply voltage mode up to that time to the sequencer during a control period by the sequencer.

5. A nonvolatile memory comprising:
a memory array in which nonvolatile memory cells are arranged;
    a charge pump operable to step up supplied voltage, and to output the step-up voltage;
    a distributor operable to select an output voltage of the charge pump for data writing or an erase operation to the memory array;
    a sequencer operable to control operation of the charge pump and the distributor; and
    an analyzer operable to determine a power supply voltage mode based on a comparison result of a reference level set up in advance and an actually supplied power supply voltage and to notify the sequencer of the power supply voltage mode concerned, operable to detect a mismatch between the power supply voltage mode notified to the sequencer and an actually supplied power supply voltage, and operable to limit the operation of the charge pump and the distributor with the use of the sequencer, based on the detection result.

6. The nonvolatile memory according to claim 5,
wherein the analyzer asserts an error signal which can limit the operation of the charge pump and the distributor with the use of the sequencer, based on the detection result of the mismatch between the power supply voltage mode notified to the sequencer and the actually supplied power supply voltage, and
wherein, when the analyzer asserts the error signal during a write or an erase to the memory array, the sequencer initializes the distributor after a charge of the charge pump has been discharged.

7. A data processing apparatus comprising:
a nonvolatile memory unit; and
a central processing unit accessible to the nonvolatile memory unit,
wherein the nonvolatile memory unit comprises
a memory array in which nonvolatile memory cells are arranged;

a charge pump operable to step up supplied power supply voltage, and to output the step-up voltage;

a distributor operable to select an output voltage of the charge pump for data writing or an erase operation to the memory array;

a sequencer operable to control operation of the charge pump and the distributor; and an analyzer operable to notify the sequencer of a power supply voltage mode selectively specified among a plurality of power supply voltage modes set up in advance corresponding to power supply voltage levels, operable to detect a mismatch between the power supply voltage mode notified to the sequencer and an actually supplied power supply voltage, and operable to assert an error signal which can limit the operation of the charge pump and the distributor with the use of the sequencer, based on the detection result.

8. The data processing apparatus according to claim 7, wherein, when the power supply voltage mode includes a first power supply voltage mode and a second power supply voltage mode which differ in the corresponding power supply voltage level with each other, the data processing apparatus comprises a detector for detecting relation among a minimum voltage in which circuit operation is possible in the first power supply voltage mode, a maximum voltage in which circuit operation is possible in the second power supply voltage mode, and an actually supplied power supply voltage, and wherein the analyzer detects a mismatch between the power supply voltage mode and an actually supplied power supply voltage, based on the detection result of the detector and the power supply voltage mode, and asserts an error signal which can limit operation of the charge pump and the distributor with the use of the sequencer, based on the detection result.

9. A microcomputer application system comprising:
a microcomputer operable to execute a predetermined program,
wherein the data processing apparatus according to claim 8 is applied as the microcomputer.

10. A microcomputer application system comprising:
a microcomputer operable to execute a predetermined program,
wherein the data processing apparatus according to claim 7 is applied as the microcomputer.

11. A data processing apparatus comprising:
a nonvolatile memory unit; and
a central processing unit accessible to the nonvolatile memory unit, wherein the nonvolatile memory unit comprises:
a memory array in which nonvolatile memory cells are arranged;

a charge pump operable to step up supplied power supply voltage, and to output the step-up voltage;

a distributor operable to select an output voltage of the charge pump for data writing or an erase operation to the memory array;

a sequencer operable to control operation of the charge pump and the distributor; and an analyzer operable to notify the sequencer of a power supply voltage mode selectively specified among a plurality of power supply voltage modes set up in advance corresponding to power supply voltage levels, operable to detect a mismatch between the power supply voltage mode notified to the sequencer and an actually supplied power supply voltage, and operable to assert an error signal which can limit the operation of the charge pump and the distributor with the use of the sequencer, based on the detection result.

12. The data processing apparatus according to claim 11, wherein, when the power supply voltage mode includes a first power supply voltage mode and a second power supply voltage mode which differ in the corresponding power supply voltage level with each other, the data processing apparatus includes a detector for detecting relation among a minimum voltage in which circuit operation is possible in the first power supply voltage mode, a maximum voltage in which circuit operation is possible in the second power supply voltage mode, and an actually supplied power supply voltage, and wherein the analyzer detects a mismatch between the power supply voltage mode and the actually supplied power supply voltage based on the detection result by the detector, and asserts an error signal which can limit operation of the charge pump and the distributor with the use of the sequencer, based on the detection result.

13. A microcomputer application system comprising:
a microcomputer operable to execute a predetermined program,
wherein the data processing apparatus according to claim 12 is applied as the microcomputer.

14. A microcomputer application system comprising:
a microcomputer operable to execute a predetermined program,
wherein the data processing apparatus according to claim 11 is applied as the microcomputer.

* * * * *